United States Patent
Du et al.

(10) Patent No.: US 7,142,627 B2
(45) Date of Patent: Nov. 28, 2006

(54) COUNTING SCHEME WITH AUTOMATIC POINT-OF-REFERENCE GENERATION

(75) Inventors: Xiao-Hong Du, Colorado Springs, CO (US); Craig Taylor, Colorado Springs, CO (US)

(73) Assignee: Ramtron International Corporation, Colorado Springs, CO (US)

(*) Notice: Subject to any disclaimer, the term of this patent is extended or adjusted under 35 U.S.C. 154(b) by 49 days.

(21) Appl. No.: 11/082,526

(22) Filed: Mar. 17, 2005

(65) Prior Publication Data

US 2006/0140332 A1    Jun. 29, 2006

Related U.S. Application Data

(63) Continuation-in-part of application No. 11/021,394, filed on Dec. 23, 2004.

(51) Int. Cl.
*H03K 23/76*    (2006.01)
(52) U.S. Cl. .......................................... 377/101; 377/89
(58) Field of Classification Search ............... None
See application file for complete search history.

(56) References Cited

U.S. PATENT DOCUMENTS

| | | | |
|---|---|---|---|
| 3,950,737 A | 4/1976 | Uchida et al. | |
| 4,947,410 A | 8/1990 | Lippmann et al. | |
| 5,222,109 A | 6/1993 | Pricer | |
| 5,475,302 A | 12/1995 | Mehnert et al. | |
| 5,535,142 A | 7/1996 | Mehnert et al. | |
| 5,565,769 A | 10/1996 | Mehnert et al. | |
| 5,708,605 A | 1/1998 | Sato | |
| 5,714,882 A | 2/1998 | Mehnert et al. | |
| 5,880,954 A * | 3/1999 | Thomson et al. | 700/79 |
| 6,084,400 A * | 7/2000 | Steinich et al. | 324/207.13 |
| 6,628,741 B1 * | 9/2003 | Netzer | 377/21 |
| 6,650,158 B1 | 11/2003 | Eliason | |
| 6,687,325 B1 | 2/2004 | Wells | |
| 6,693,839 B1 | 2/2004 | Onozuka et al. | |
| 6,721,385 B1 | 4/2004 | Siess et al. | |
| 6,735,269 B1 | 5/2004 | Siess et al. | |
| 2006/0140332 A1 * | 6/2006 | Du et al. | 377/101 |

* cited by examiner

*Primary Examiner*—Timothy P. Callahan
*Assistant Examiner*—Cassandra Cox
(74) *Attorney, Agent, or Firm*—Hogan & Hartson L.L.P.

(57) ABSTRACT

A counting scheme for a non-volatile counter includes automatic point-of-reference generation implemented in a state machine. Two state variables are used to store the rotation history of the magnet. One variable stores the previous position of the magnet and the other stores the net angle traveled by the magnet from the reference point. The first pulse location after the counter is reset is automatically selected as the reference point until the next counter reset. When the nonvolatile counter counts up or down, i.e. when the magnet travels 360° in either direction, the second state variable is set to zero and the first state variable is set to the reference point, indicating the start of a new revolution.

5 Claims, 14 Drawing Sheets

ILLUSTRATION OF REVOLUTION
COUNTING WITH EIGHT SENSORS

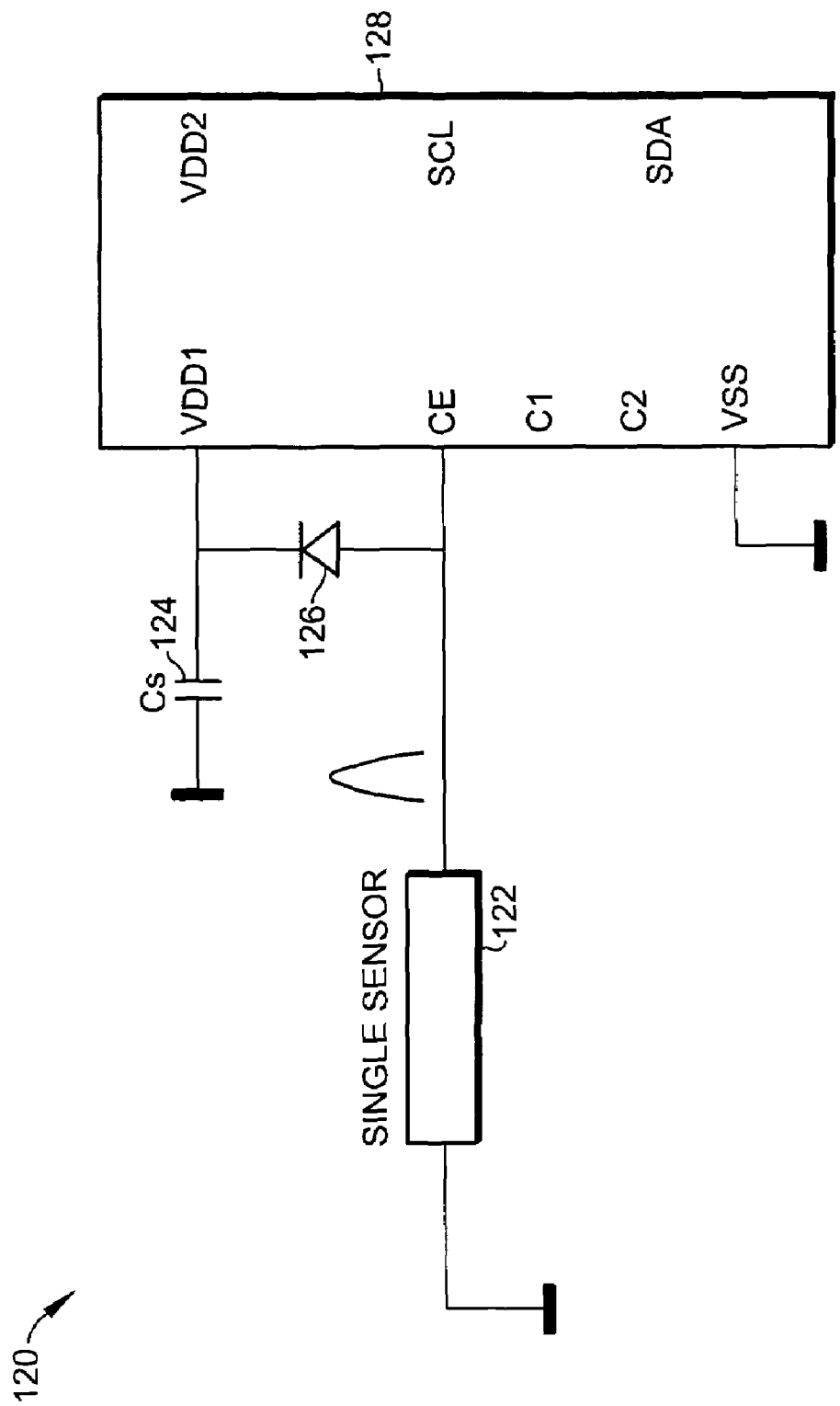

COUNTING SCHEME WITH AUTOMATIC POINT-OF-REFERENCE GENERATION

RELATED APPLICATION

The present application is a continuation-in-part of U.S. patent application Ser. No. 11/021,394 filed Dec. 23, 2004, entitled NON-VOLATILE COUNTER.

BACKGROUND OF THE INVENTION

The present invention relates, in general, to the field of counter circuits. More particularly, the present invention relates to a counting scheme for counting revolutions with an automatic point-of-reference generation at the time of counter reset.

This application is a continuation-in-part of my co-pending application, Ser. No. 11/021,394 filed on Dec. 23, 2004 and entitled "NON-VOLATILE COUNTER", which is assigned to the assignee of the present application.

Counter circuits, and even non-volatile counter circuits are known by those skilled in the art. Existing non-volatile counter circuits use, for example, flash memory, battery-backed memory, EEPROM or other electrically programmable non-volatile memory, as well as other technologies. Problems faced with existing non-volatile counter circuits include, but are not limited to low maximum count value and short counter life, errors due to imprinting problems, as well as limited use in low-power sensor applications due to excessive power consumption especially while the count is being updated.

A non-volatile technology that is more suited to counter circuits, especially in applications where only low power levels are provided by a sensor, is ferroelectric technology. Ferroelectric cells consume little power during reading or writing data. For low density applications such as a counter, memory cells containing two transistors and two ferroelectric capacitors, ("2T/2C") can be used. Ferroelectric 2T/2C memory products are manufactured and sold by Ramtron International Corporation FRAM. A 2T/2C memory is also described in U.S. Pat. No. 4,873,664 entitled "Self Restoring Ferroelectric Memory", which is also hereby incorporated by reference.

Revolution counter circuits are known by those skilled in the art. The counting scheme in the existing revolution counters is based on a fixed point-of-reference, which can be explained with the aid of FIG. 1. In FIG.1, a number of magnetic sensors C1, C2, . . . , C8 are installed around a rotary shaft with a permanent magnet. When the magnet rotates and passes a sensor, a voltage pulse is generated from the sensor. Thus, the current position of the magnet can be determined from the location of the sensor generating the pulse. However, for revolution counting, the total angle of magnet rotation must be determined from some point-of-reference. In prior art counting schemes, a fixed point, for example counter C1, is selected as the reference point. Whenever the magnet travels 360° clockwise from the reference point, i.e. passes the reference point twice clockwise, the number of revolutions is counted up by one; whenever the magnet travels 360° anticlockwise from the reference point, the number of revolutions is counted down by one. The disadvantage of the fixed point-of-reference counting techniques of the prior art is that the initial angle error could be one revolution. For example, the magnet is initially located between sensors C1 and C2, and it rotates clockwise. All of the rotation angle before the magnet reaches sensor C1 at the first time is not counted. Such a large error is not tolerable in many applications.

What is desired is a counting scheme that automatically generates the point-of-reference at the time of counter reset. More specifically, it is desired that the first pulse location after the counter is reset is automatically selected as the reference point until the next counter reset. In the example above, C2 is selected as the reference point, and thus the maximal error with the desired counting scheme is the angle between sensors C1 and C2.

SUMMARY OF THE INVENTION

According to an embodiment of the present invention, a non-volatile counter circuit includes a state machine having a first input for receiving one or more control signals, a second input for receiving a current count value, a third input for receiving historical information, and an output for providing a next count value and an up/down control signal, and a non-volatile counter having an input coupled to the output of the state machine, and an output for providing a non-volatile count value. The non-volatile counter can be implemented onto a single integrated circuit using ferroelectric memory technology. The non-volatile counter circuit includes a first power supply node and a second power supply node for receiving power for operating the non-volatile counter circuit through a first power supply or a second power supply, or both. The first and second power supplies can be low energy power supplies such as that provided by a sensor, or can be conventional power supplies. Either of the first and second power supplies can be internally boosted using an internal voltage doubler or other boosting circuitry.

A counting scheme with an automatic point-of-reference generation is implemented in the state machine. Two state variables, P and D, are used to store the rotation history of the magnet. P stores the previous position of the magnet and D stores the net angle traveled by the magnet from the reference point. The first pulse location after the counter is reset is automatically selected as the reference point until the next counter reset. When the counter is reset, D is set to zero. Then, when the magnet passes a sensor, the net angle traveled by the magnet with respect to the reference point can be updated from the previous position P, the current position CP, and the previous value stored in D. For example, if P=C2 and CP=C3 and clockwise is defined as positive, then D is updated by the angle between C2 and C3, and at the same time P is updated to C3. When the magnet travels 360° in one direction, for example clockwise, with respect to the reference point, the nonvolatile counter counts up by one; when the magnet travels 360° in the other direction, anticlockwise, with respect to the reference point, the nonvolatile counter counts down by one. When the nonvolatile counter counts up or down, i.e. when the magnet travels 360° in either direction, the state variable D is set to zero and the state variable P is set to the reference point, indicating the start of a new revolution.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 8 is a block diagram of an application of the non-volatile counter of the present invention for counting up and counting down;

DESCRIPTION OF A REPRESENTATIVE EMBODIMENT

Figure 2A:
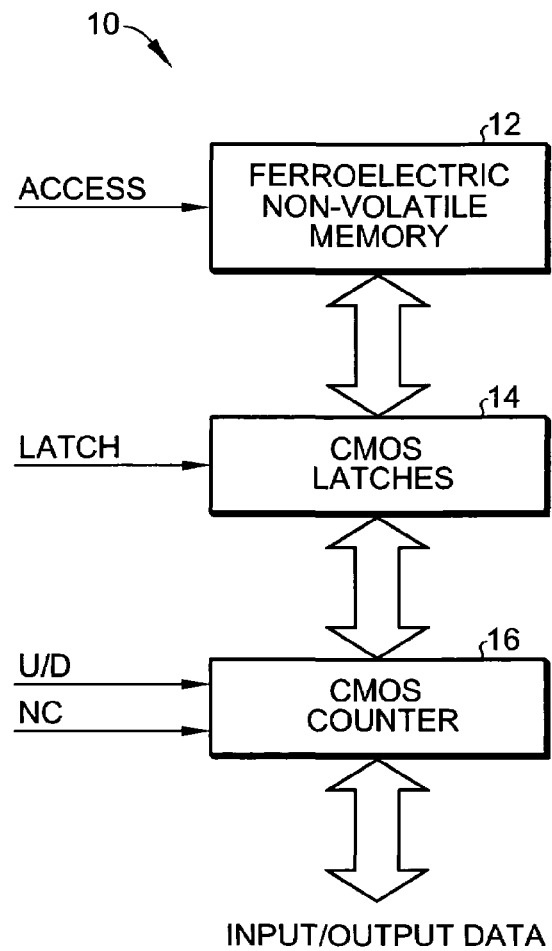
FIGS. 2(a) and 2(b) are block diagrams of the core of the non-volatile counter according to an embodiment of the present invention.

Referring now to FIG. 2(a), the functional block diagram of the core 10 of the non-volatile counter according to an embodiment of the present invention is shown. Core 10 includes a ferroelectric non-volatile memory 12, CMOS latches 14, and a CMOS counter 16. The ferroelectric non-volatile memory 12 stores the previous count value, the CMOS latches 14 act as a data relay between the ferroelectric memory 12 and the CMOS counter 16, and the CMOS counter 16 performs the counting operations. Whenever a counting operation is required, the ACCESS signal goes high to start an access to the ferroelectric memory 12 and the previous count value is readout and latched to the CMOS latches 14. According to the control signals U/D and NC, the CMOS counter 16 performs counting up, counting down, or no counting. The resulting data are sent back to the ferroelectric memory 12 to update the count value through the CMOS latches 14.

Figure 3:
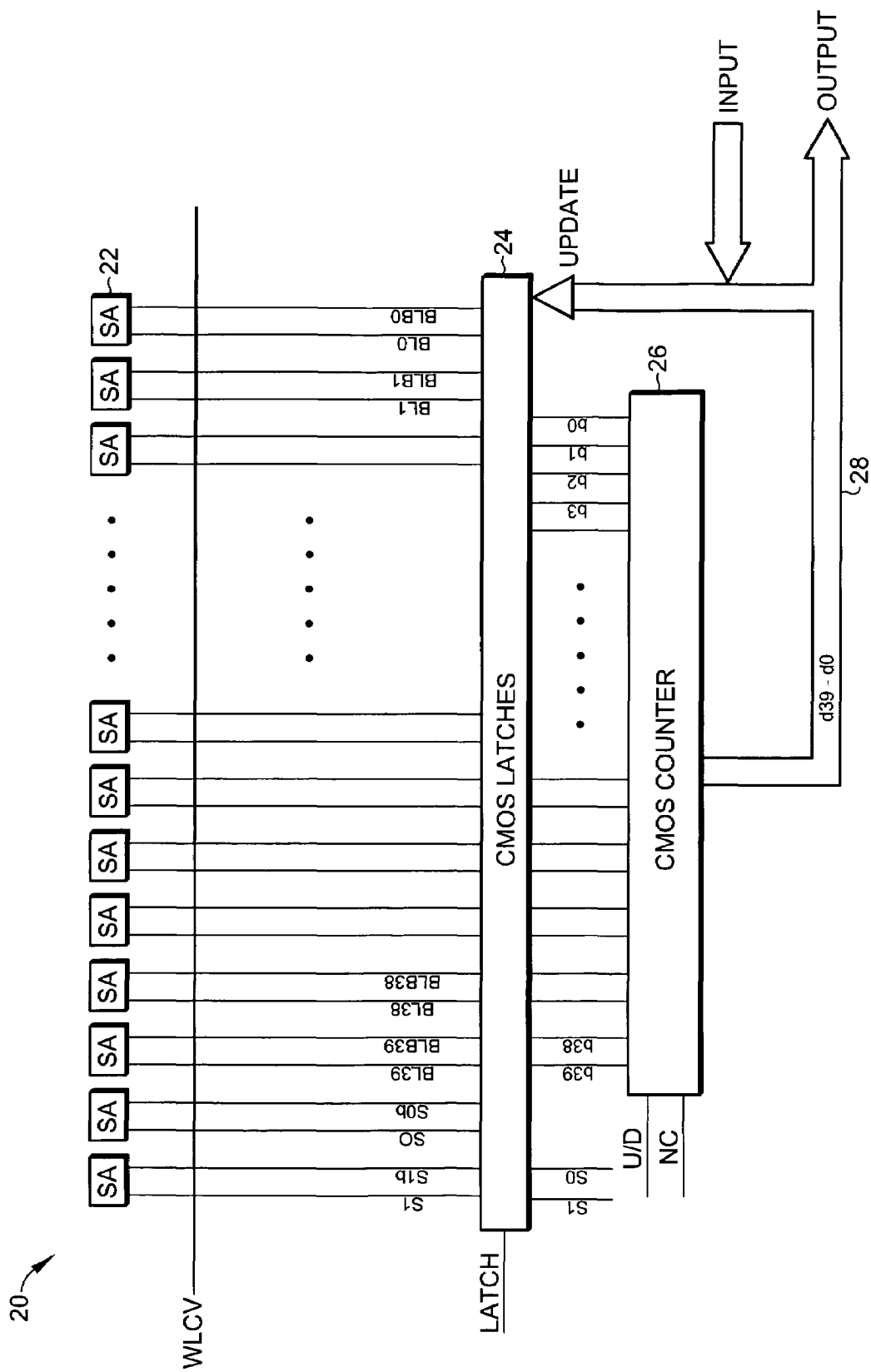
FIG. 3 is a schematic diagram of the implementation of the core of the non-volatile counter according to an embodiment of the present invention.

The implementation of the core 20 of a 40-bit counter is shown in FIG. 3. The upper portion of FIG. 3 is a standard 2T/2C memory with one row WLCV for storing the count value. After the data is read out from the memory, it is latched by the CMOS latches 24 when the control signal LATCH goes high. The count value is stored in BL39–BL0. In addition to the count value, there are extra columns for storing previous states which may be used to determine current counting operations. FIG. 3 shows two columns, S1–S0 (and complementary data columns S1b and S0b), but more columns can be used if desired. The latched data b39–b0 is fed to the CMOS counter 26. There are two control signals for the counter 26, U/D and NC. The counter 26 performs a counting operation only if NC is zero; otherwise, it just passes the data like a buffer. For example, NC is set to one when the user is reading or writing the count value. The NC signal must be reset to zero to do a counting operation. Whether counting up or counting down is performed is determined by the U/D signal. If U/D is one, the counter 26 counts up; otherwise, it counts down. What operation is selected is dependent on the desired application. For different applications, control signals U/D and NC are different functions of user input and the previous states S1–S0. These functions are implemented in a block called count control, which are described in further detail below. The CMOS lathes 24 are bi-directional. They can keep the values of b39–b0 and, at the same time, pass the counting result d39–d0 to the memory. The data after the counter, d39–d0, are fed to two paths: one is to the OUTPUT bus if the operation is read and the other is to the CMOS latches 24 to update the values in the memory through the UPDATE bus. The count value can be set by the user through the INPUT bus.

Figure 2B:
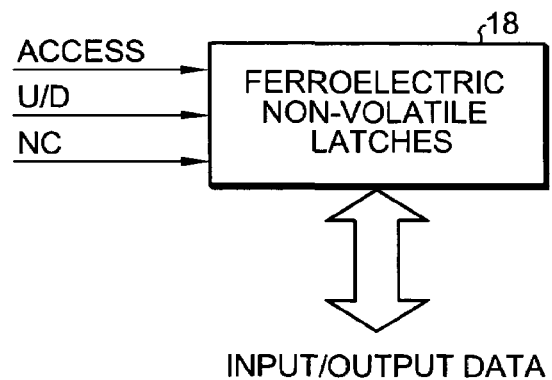

Another implementation of the core of the non-volatile counter according to the present invention is to use ferroelectric nonvolatile latches 18 as is shown in FIG. 2(b). The blocks of the ferroelectric memory, the CMOS latches, and the CMOS counter can be combined together by using ferroelectric nonvolatile latches 18.

Figure 4:
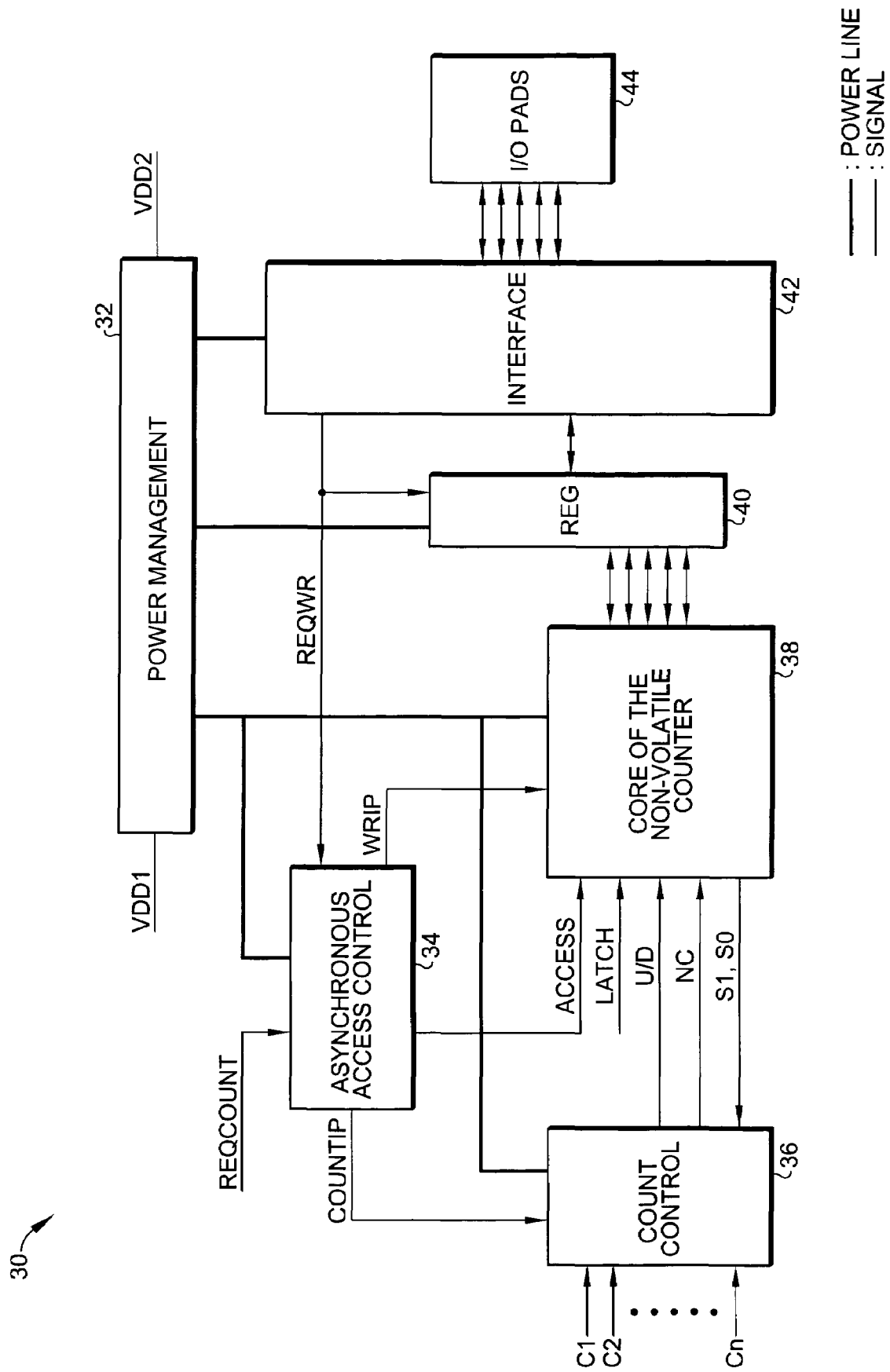
FIG. 4 is a block diagram of the core of the non-volatile counter showing peripheral logic blocks.

FIG. 4 shows a non-volatile counter 30 according to the present invention. The core of the non-volatile counter 30 is as shown in FIGS. 2 and 3. The structure is the same for all the applications, but the number of bits for the count value and the number of the previous states can be adjusted for different application requirements. The power management block 32 and the interface 42 are also dependent on applications and the user's requirements. The interface 42 can be a standard serial port such as $I^2C$ and SPI or a parallel port. One of the advantages that uniquely belong to the non-volatile counter 30 is that its power supply can be just a pulse. FIG. 4 shows two power supplies, VDD1 and VDD2. One of them or both of them can be pulses. Two examples of power management methods are described in further detail below. The REG block 40 contains bi-directional CMOS registers which provides the function of relaying data from the counter 38 to the interface 42 or vice versa.

A count request and a read/write request may occur at the same time. Therefore, an Asynchronous Access Control block 34 is added to enable just one access at a time and put the other access on hold until the end of the previous access. A simplified circuit for asynchronous access control is shown in FIG. 5 and is explained in further detail below.

During each counting operation, the previous count value is read from the ferroelectric memory and fed into the CMOS counter. After the counting operation, the new count value overwrites the previous value in the ferroelectric nonvolatile memory. Now still referring to FIG. 4, a counting operation is started with the REQCOUNT signal going high. The asynchronous access control circuit block 34 responds to the counting request and pulls the COUNTIP and ACCESS signals high to start reading the count value and the previous states from the ferroelectric memory. The count control block 36 sets the level of U/D and NC according to user input signals C1, C2, . . . Cn and the previous states S1 and S0. Then, the corresponding count operation is performed and the data will be updated as described above.

Figure 5:
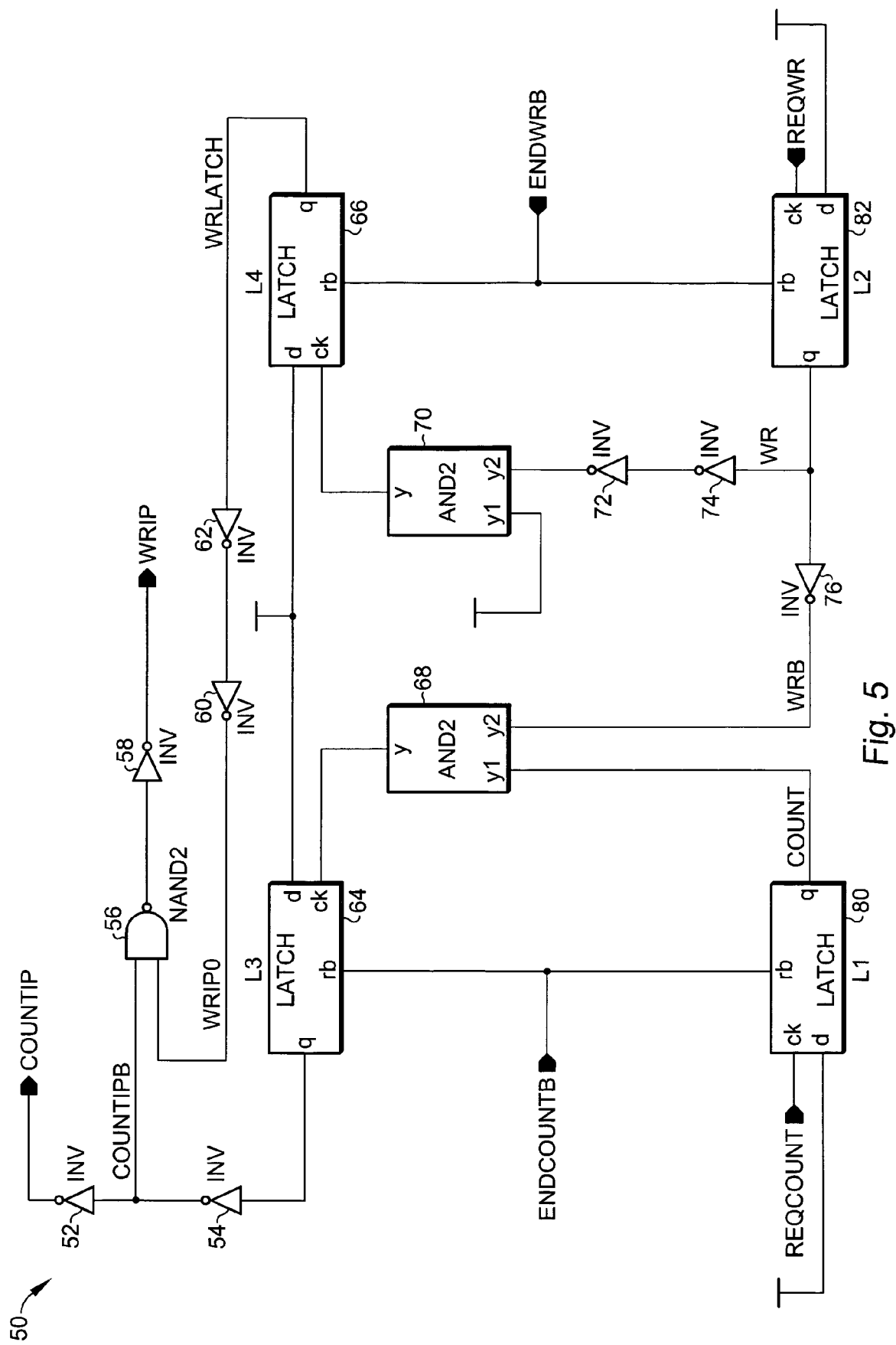
FIG. 5 is a simplified circuit for the asynchronous access control of the non-volatile counter.

FIG. 5 is the simplified circuit 50 for the asynchronous access control. There are four latches L1–L4, designated 80, 82, 64, and 66. When the input CK signal to a latch goes from low to high, the data at the input pin D is latched. The input pin RB is an active-low reset. When RB is low, the output state of the latch is reset to zero. During power up, both ENDCOUTB and ENDWRB are low and all the latches are reset to zero. As a result, COUNTIP and WRIP are zero. After the chip is powered up, ENDCOUNTB and ENDWRB become high to enable the asynchronous access control. The input pins REQCOUNT and REQWR are for count request and write/read request, respectively. If REQCOUNT becomes high before REQWR becomes high, then WRB is one when COUNT becomes one. Thus, the input pin CK of L3 changes from zero to one and a one is latched by L3. As a result, COUNTIP changes from zero to one to start a counting operation and COUNTIPB changes from one to zero to keep WRIP at zero and block any write/read access. As long as COUNTIP is one and COUNTIPB is zero, WRIP is kept at zero and any write/read request is blocked. When the count operation is finished, a low pulse is applied on ENDCOUNTB to reset latches L1 and L3. After latches L1 and L3 are reset, COUNTIPB becomes one to release the path for the write/read request. On the contrary, if REQWR becomes high before REQCOUNT becomes high, WRB becomes zero before COUNT becomes one. Thus, the input pin CK of latch L3 is zero as long as WR is one and any count request is blocked. After some delay, the input pin CK of latch L4 becomes one and latches one to the output pin Q of latch L4. Then, WRIP becomes one to start a write/read access.

A count request and a W/R request may occur at the same time. In this case, there are two possibilities: either latch L3 successfully latches a one or not. If latch L3 latches a one, then COUNTIPB becomes one before WRIP0 becomes one since more delays are added on the right path for a W/R request. Then, a count operation is started and the W/R request is blocked until the end of the counting operation. On the other hand, if latch L3 is not able to latch a one, then the input pin CK of latch L3 remain zero since WRB is zero. So, the count request is blocked and a W/R operation is started. At the end of W/R operation, a low pulse is applied to ENDWRB to reset latches L2 and L4. After latches L2 and L4 are reset, WRB changes from zero to one to release the count request. Therefore, the deadlock case, (i.e. both count request and W/R request occur at the same time, but they block each other and no access is started), and the double access case, (i.e. both COUNTIP and WRIP become high at the same time), are excluded by adding more delay on the data path for the W/R request. In any case, only one access is started at a time by circuit 50 and the other access is put on hold until the previous access is done.

Figure 6:
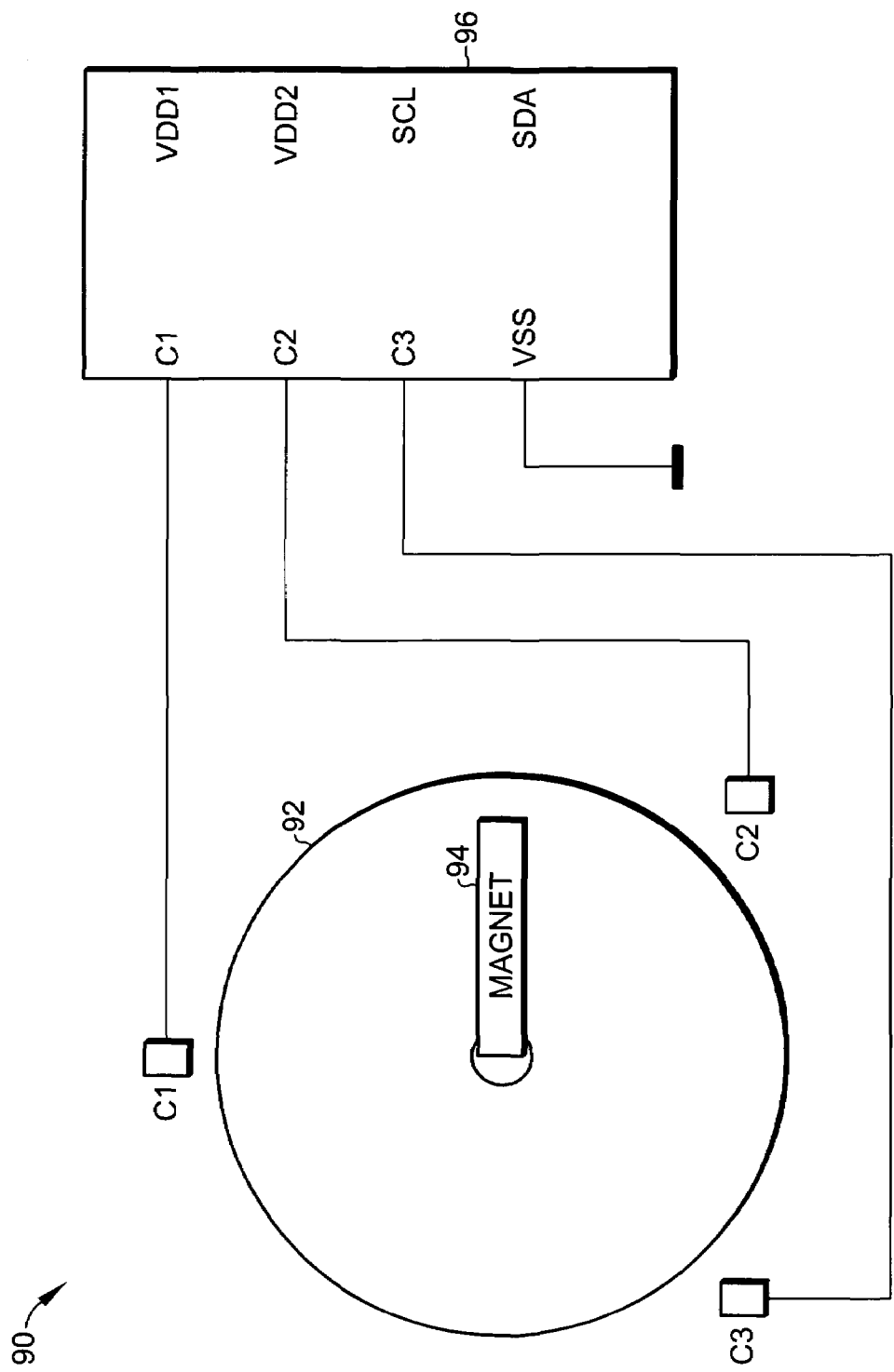
FIG. 6 is a block diagram of an application of the non-volatile counter of the present invention for providing a revolution count.

Referring now to FIG. 6, a typical application 90 is shown in which three magnetic sensors equally are distributed around a rotating shaft 92 including a magnet 94 such as in an automotive application are coupled to the C1, C2, and C3 counter inputs of non-volatile counter 96. There are two power supplies, VDD1 and VDD2. Either of VDD1 and VDD2 can be a standard power supply or a pulse from a sensor. SCL and SDA are two pins for a standard serial communication to non-volatile counter 96.

Figure 7A:
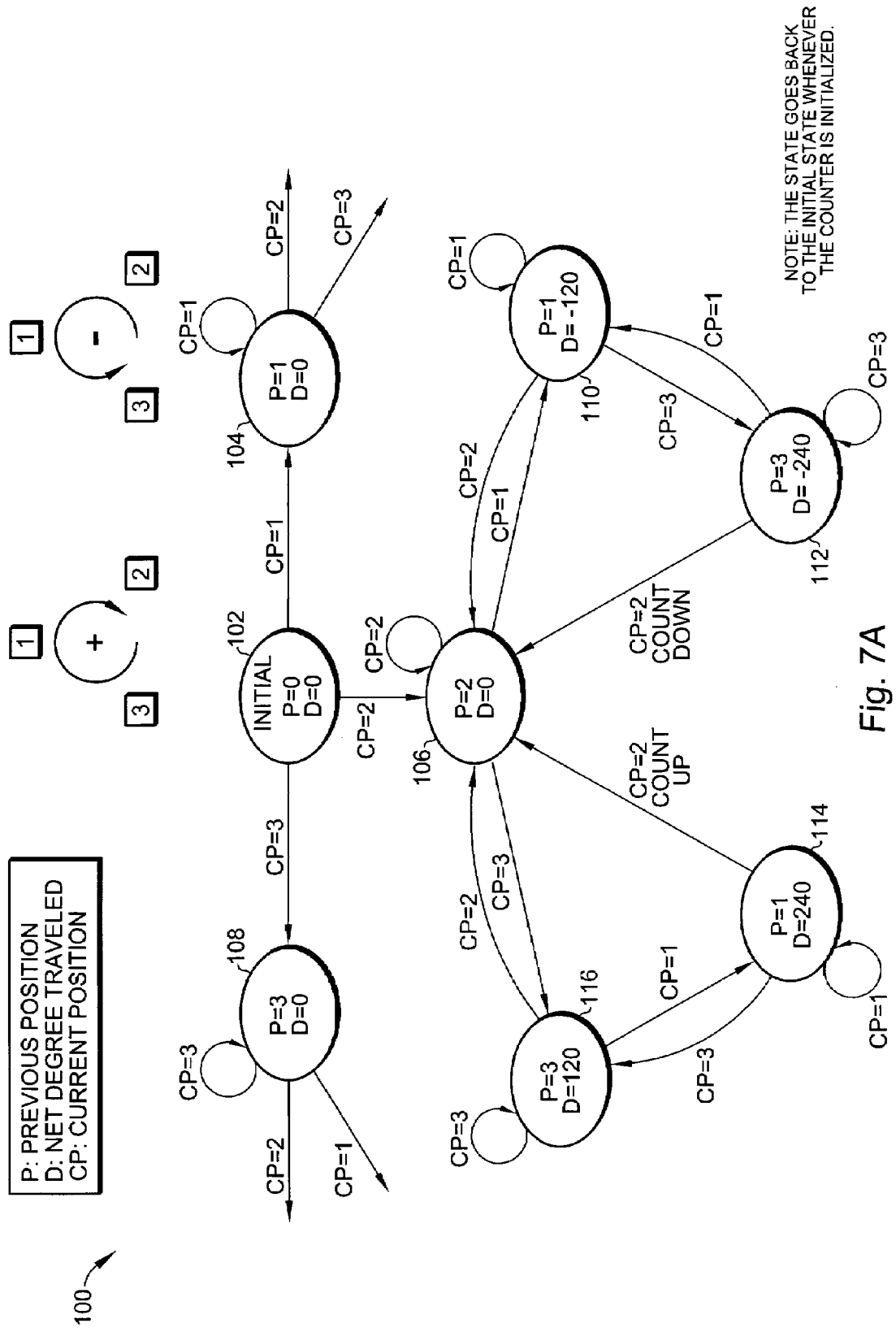
FIG. 7(a) is the state diagram for the revolution count application of FIG. 6 according to the present invention wherein sensor C2 is automatically selected as the point-of reference.

The state machine diagram FIG. 7(a) is the counting sequence 100 for three sensors installed around a circle as shown in FIG. 6. When the magnet 94 rotates a full circle clockwise or anticlockwise, the counter counts up or down by one, respectively. Thus, the history of the magnet 94 and the current position is the required information to determine the corresponding counting operation. The history of the magnet 94 includes the previous position of the magnet and how many degrees it has traveled from a reference point. The reference point is not fixed, but rather is the first pulse position after the counter is reset. For example, if the magnet stays between positions 1 and 2 when the counter is reset and the magnet then passes position 2 clockwise after the reset, then the reference point for the counting sequence will be position 2 until the counter is reset again.

Figure 1:
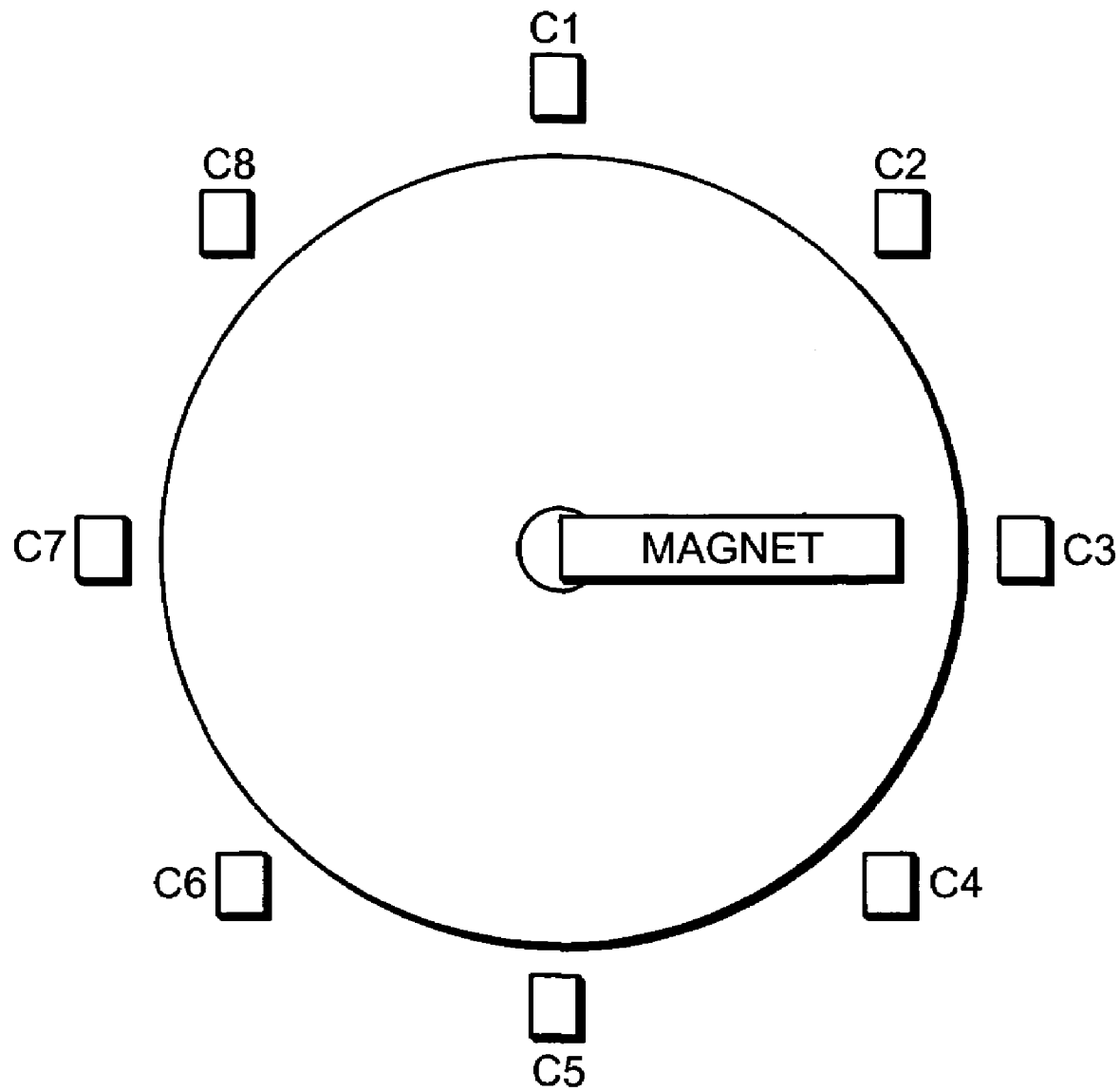
FIG. 1 illustrates revolution counting with eight sensors and a magnet that rotates about a central shaft.
Figure 7B:
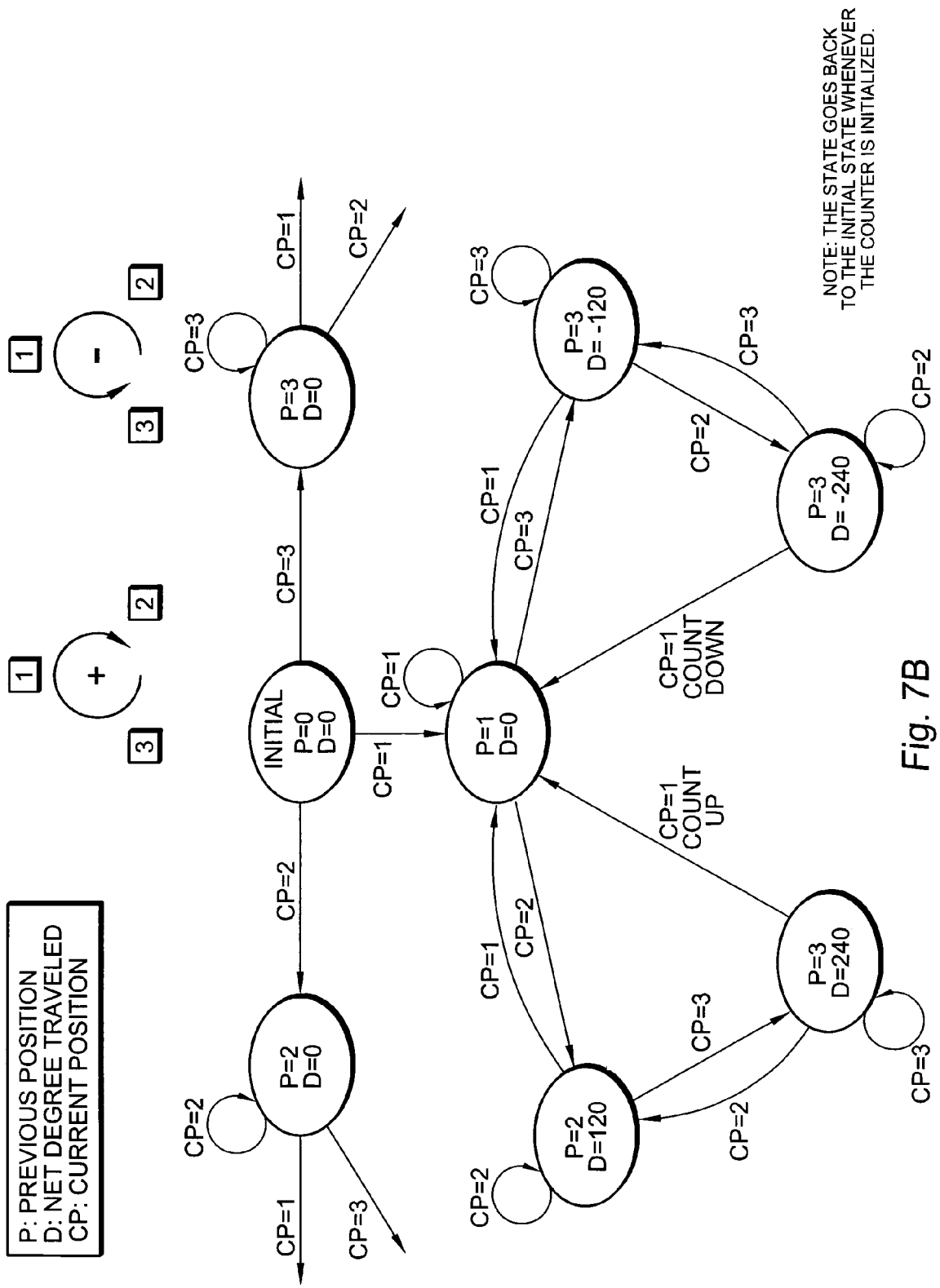
FIG. 7(b) is the state diagram for the revolution count application of FIG. 6 according to the present invention wherein sensor C1 is automatically selected as the point-of reference.
Figure 7C:
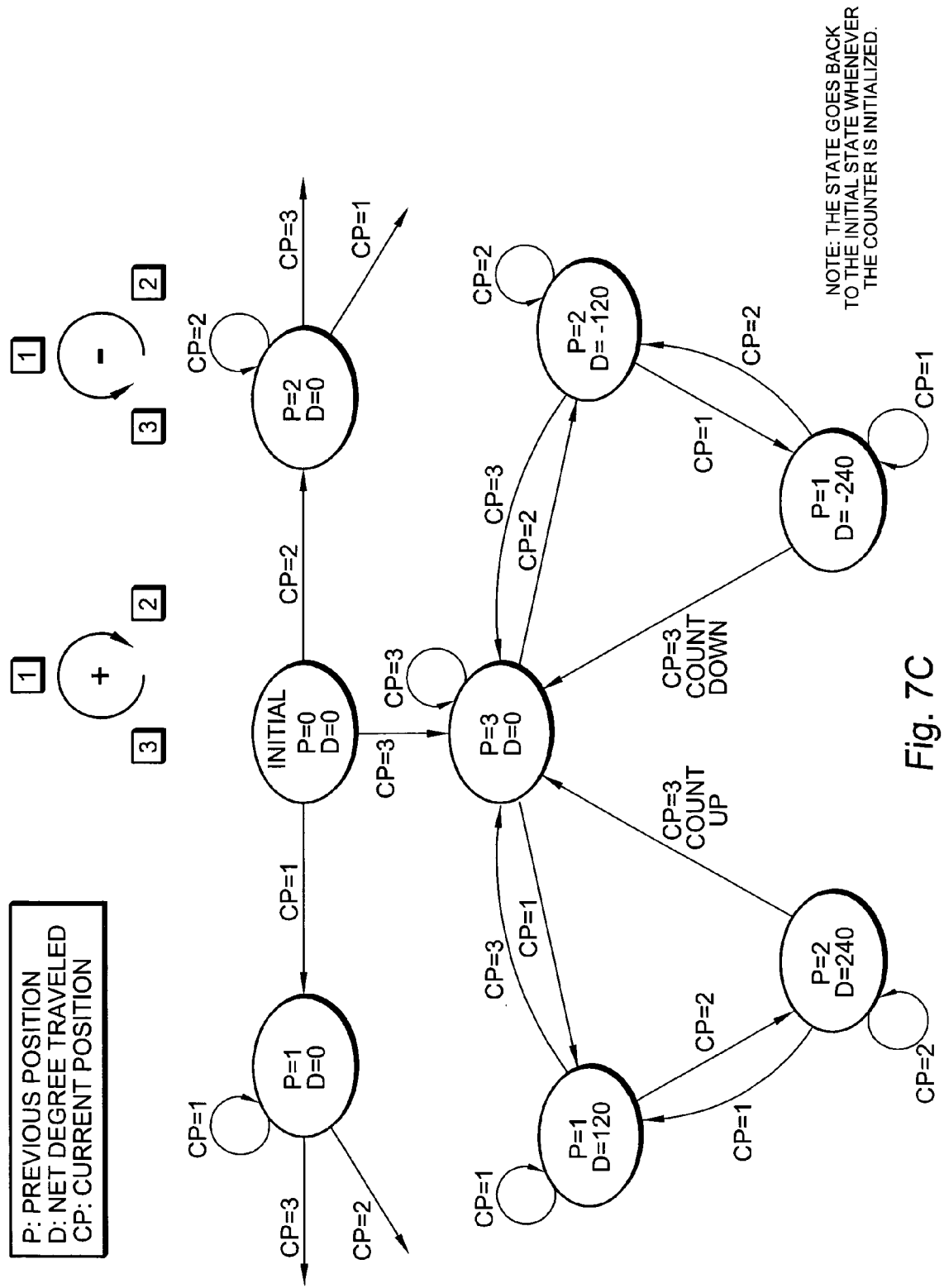
FIG. 7(c) is the state diagram for the revolution count application of FIG. 6 according to the present invention wherein sensor C3 is automatically selected as the point-of reference.

Two state variables, P and D, are used to store the rotation history of the magnet. P stores the previous position of the magnet and D stores the net angle traveled by the magnet from the reference point. The first pulse location after the counter is reset is automatically selected as the reference point until the next counter reset. When the counter is reset, D is set to zero. Then, when the magnet passes a sensor, the net angle traveled by the magnet with respect to the reference point can be updated from the previous position P, the current position CP and the previous value stored in D. For example, referring to FIG. 1, if P=C2 and CP=C3 and clockwise is defined as positive, then D is updated by the angle between C2 and C3, and at the same time P is updated to C3. When the magnet travels 360° in one direction, for example clockwise, with respect to the reference point, the nonvolatile counter counts up by one; when the magnet travels 360° in the other direction, anticlockwise, with respect to the reference point, the nonvolatile counter counts down by one. When the nonvolatile counter counts up or down, i.e. when the magnet travels 360° in either direction, the state variable D is set to zero and the state variable P is set to the reference point, indicating the start of a new revolution. All of the possibilities of the magnet movement are shown in FIGS. 7(a), 7(b), and 7(c), and described in further detail below. In the diagram of FIG. 7(a), "P" is the previous position of the magnet. The initial value of P is zero before the first input pulse from any of C1, C2, or C3. In the diagram of FIG. 7(a), "D" records how many degrees the magnet has traveled from the first pulse position. D is positive for clockwise and negative for anticlockwise. Both P and D are initialized. to zero whenever the counter is reset. P is encoded with two bits and D is encoded with three bits. Thus, the number of the previous states is five, i.e. S4–S0, instead of two as previously shown. In FIG. 7(a), "CP" is the current pulse position and indicates the origin of the pulse (C1, C2, or C3). FIG. 7(a) shows only the complete portion of the counting sequence for the first pulse coming from position 2. Since the three positions are logically identical, the counting sequences for the reference point being position 1 and 3 are very similar and are not shown in FIG. 7(a). As an example, assume the first pulse comes from position 2. When a pulse is received from position 2 at the initial state 102, position 2 is selected to be the new reference point. P is updated to 2 and D is still zero since the magnet is at the new reference point. The state changes from 102 to 106. At state 106, if the magnet swings around sensor 2 without passing either 1 or 3, the state will not change even though pulses may come from position 2. If the magnet passes position 1, then CP is 1 and the state goes to 110. P is updated to 1 and D is updated to −120 since the magnet traveled 120° anticlockwise from the reference point, position 2. If the magnet travels back to position 2, the state returns to 106.

But if the magnet travels to position 3, P is updated to 3 and D is updated to −240. The state then goes to 112. If the magnet continually moves to position 2, the magnet travels −360° from the reference point and the counter counts down by one. At the same time, the state returns to 106. The counting sequences for other possible movements of the magnet are similar.

Since the three positions are logically equivalent, the counting sequences for the reference point being position 1 and 3 are very similar and are omitted in FIG. 7(*a*), but are shown in FIGS. 7(*b*) and 7(*c*). In FIG. 7(*b*), a state diagram of the counting scheme according to the present invention is shown in which sensor C1 is automatically selected as the point-of-reference. In FIG. 7(*c*), a state diagram of the counting scheme according to the present invention is shown in which sensor C3 is automatically selected as the point-of-reference. As mentioned above, the sensor that gives out the first pulse after the counter is reset is automatically selected as the reference point for the counting sequence until the next counter reset.

Referring now to FIG. 8, another application 120 using a single sensor input is shown. As mentioned above, the advantage of the non-volatile counter 128 according to an embodiment of the present invention is that the power supply can be a short voltage pulse. In FIG. 8, the output from a sensor 122 is also sent to VDD1, one of the supply pins, through a diode 126, as well as to the sensor input CE. Any power source can be used to power up VDD1. The power could be from a sensor 122 as shown in FIG. 8 or it could be another separate energy supply, such as a conventional power supply. A storage capacitor Cs, designated 124, is used to save the energy for counting, but capacitor 124 is not needed if the voltage pulse applied to VDD1 stays longer than the pulse applied on CE which triggers a counting operation. When a pulse is applied on CE, the signal REQCOUNT in FIG. 4 becomes high after some delay and the counter 128 performs one of three operations: counting up, counting down, or no counting, according to the logic relationships between U/D, NC, C1, C2, S1 and S0, which is defined by applications and implemented in the count control block 36 shown in FIG. 4.

Figure 9:
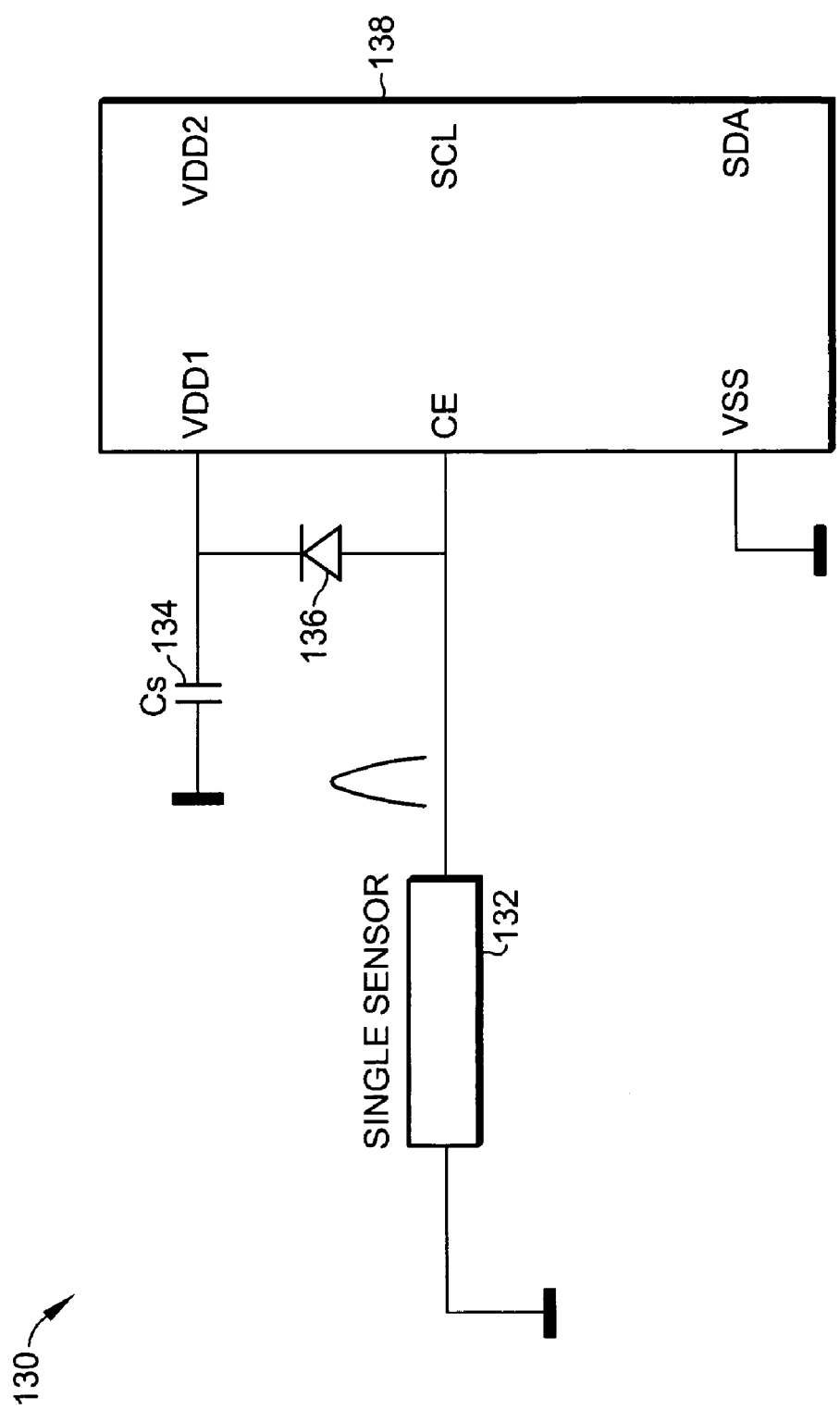
FIG. 9 is a block diagram of an application of the non-volatile counter of the present invention for counting up only.

Referring now to FIG. 9, another application 130 is shown using a single sensor input. When a pulse is applied on CE, the signal REQCOUNT in FIG. 4 becomes high after some delay and the counter 138 counts up by one. Thus, in FIG. 4, signal U/D is always set to one and NC is just the complement of COUNTIP.

Figure 10:
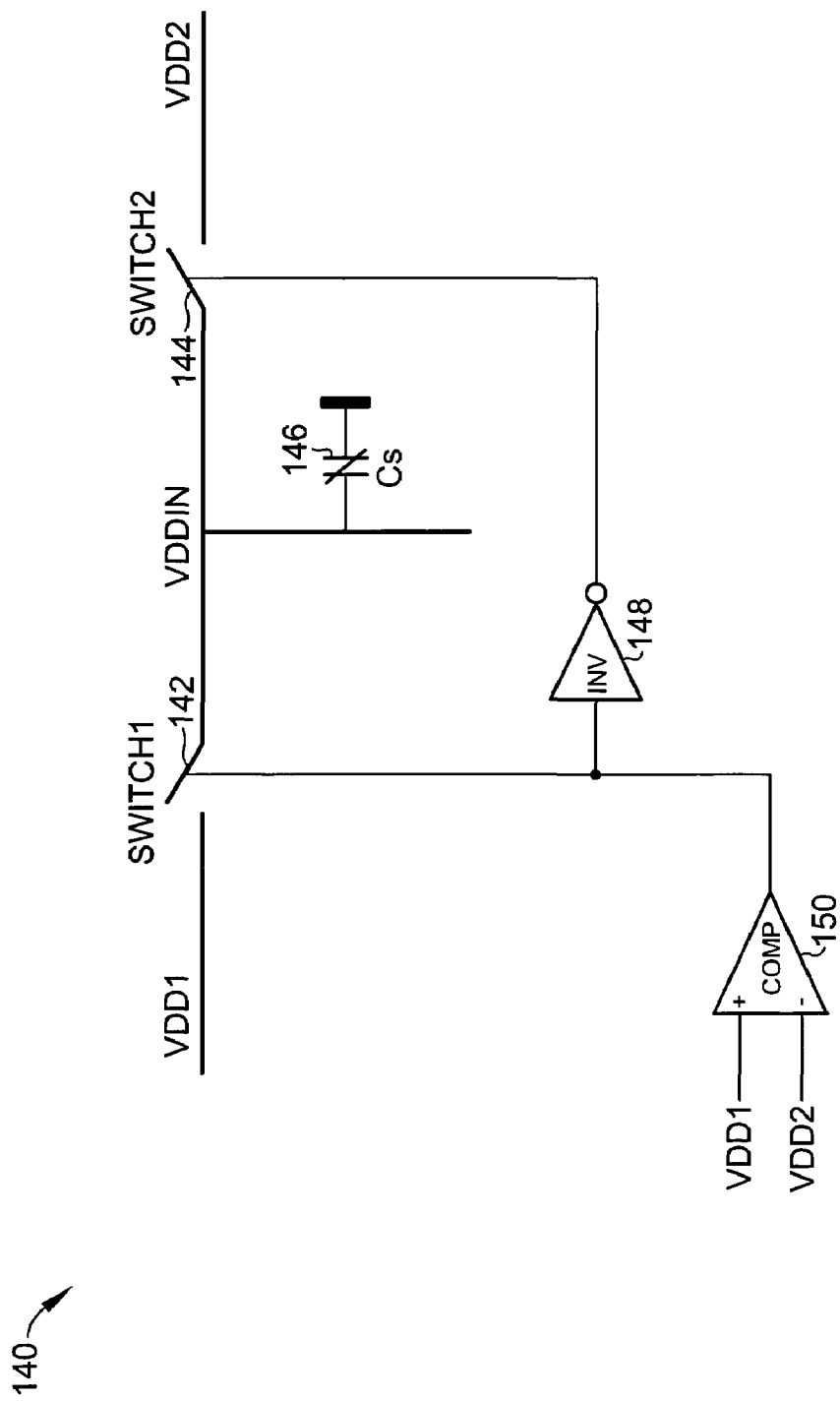
FIG. 10 is a simplified circuit diagram of a power switch for power management in the non-volatile counter of the present invention.
Figure 11:
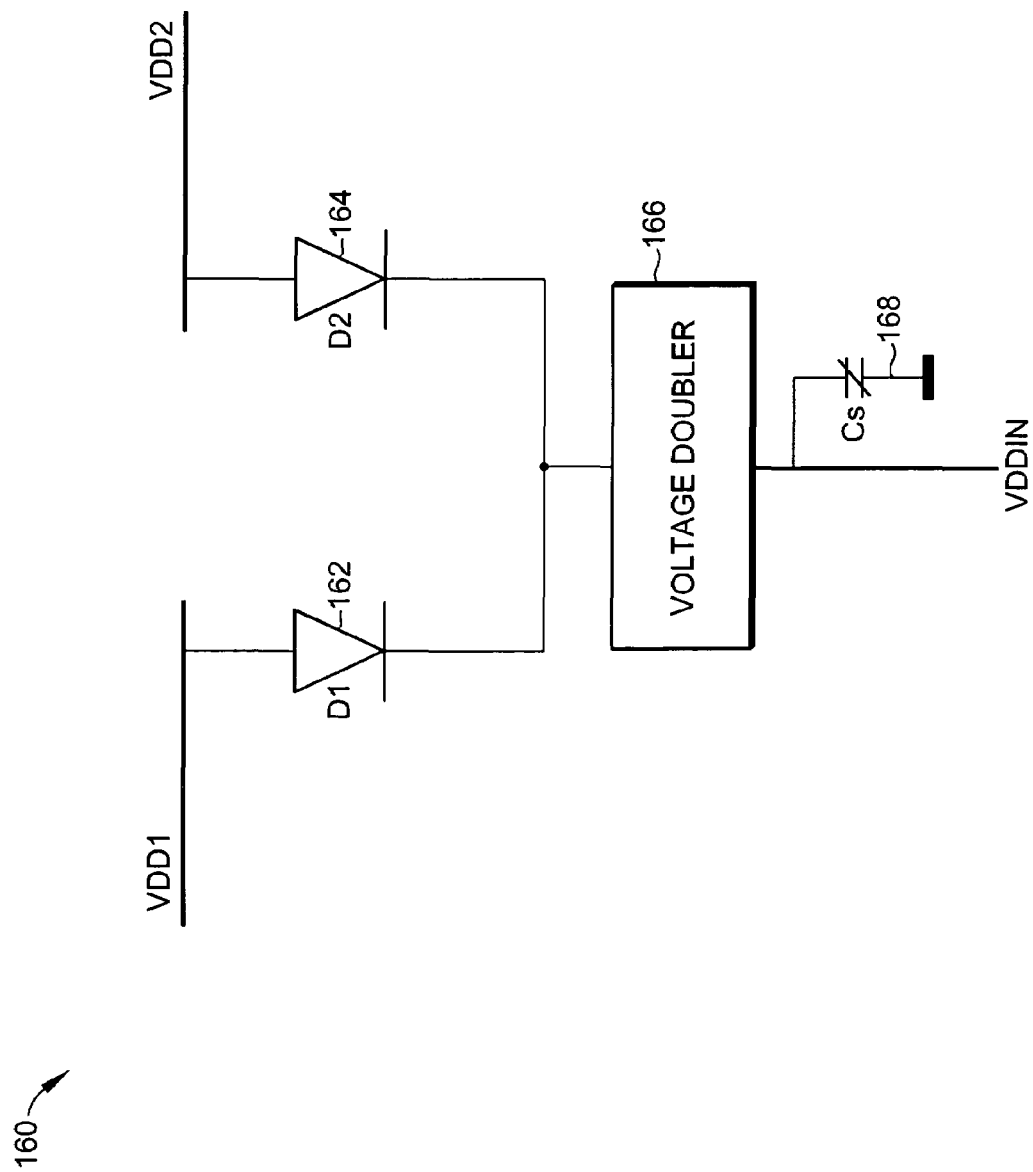
FIG. 11 is a simplified circuit diagram of a power "OR"-type circuit and a voltage doubler circuit for power management in the non-volatile counter of the present invention.

Two power management methods are shown in FIGS. 10 and 11. In FIG. 10, two power switches 142 and 144 are used to connect one of the power supplies, VDD1 and VDD2, to internal power bus VDDIN. A comparator COMP, designated 150, is used to select the higher level power supply. A ferroelectric capacitor Cs, designated 146, is used as an energy storage capacitor. An inverter 148 is used to provide the correct polarity switching signal to switch 144. In FIG. 11, two diodes, D1 and D2, respectively designated 162 and 164, are used to apply the higher of VDD1 and VDD2 to the voltage doubler block 166. Ferroelectric capacitor 168 is used as an energy storage capacitor. A voltage doubler 166 is used to double the internal voltage VDDIN.

Figure 12:
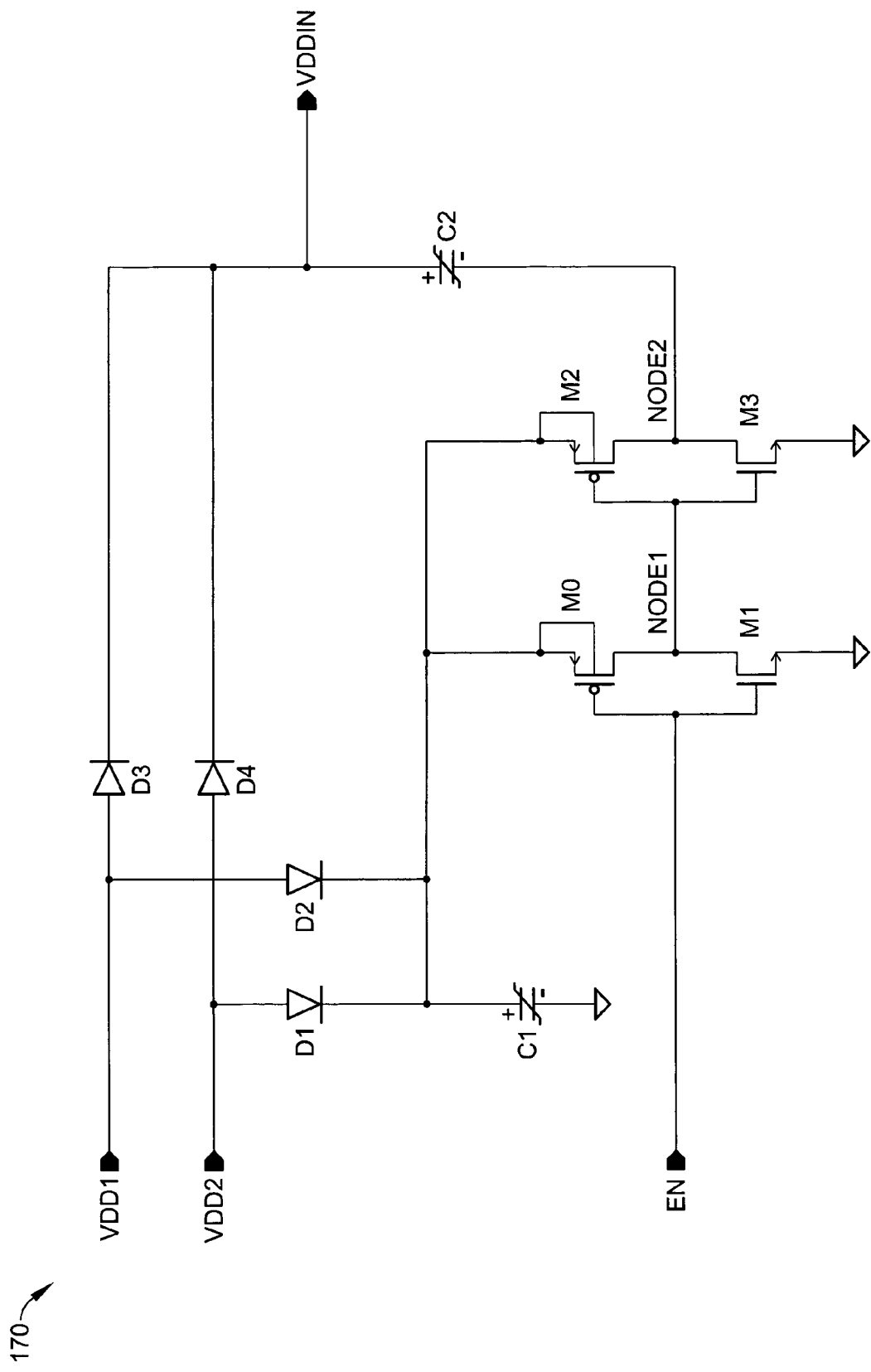
FIG. 12 is a simplified transistor-level circuit diagram for the voltage doubler of FIG. 11.

A voltage doubler circuit 170 is shown in FIG. 12. Diodes D1–D4 form a power "OR" type operation as described above. The higher voltage between VDD1 and VDD2 charges ferroelectric capacitors C1 and C2. During the charging period, the enable signal EN is kept at zero and thus NODE2 is also zero. After capacitors C1 and C2 are charged up, enable signal EN becomes high and NODE1 becomes low to drive NODE2 to the potential on the top electrode of capacitor C1. As a result, the internal voltage VDDIN is about two times that of the voltage on C1.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A counting method for a non-volatile counter comprising:
    choosing a sensor for generating an initial pulse after resetting the counter as a reference for all future counting operations; and
    combining the initial sensor pulse, a previous sensor location, and the current sensor location to generate a count value.

2. The method of claim 1 further comprising providing three circularly installed sensors.

3. The method of claim 1 further comprising providing eight circularly installed sensors.

4. The method of claim 1 further comprising providing first, second, and third counter control signals, any one of which serves as a reference signal.

5. A counting scheme for a non-volatile counter with an automatic point-of-reference generation implemented in a state machine comprising:
    using two state variables to store the rotation history of a rotating magnet, wherein a first state variable stores the previous position of the magnet and a second state variable stores the net angle traveled by the magnet from the reference point; and
    automatically selecting the first pulse location after the counter is reset as the reference point until the next counter reset.

* * * * *